United States Patent
Wu et al.

(10) Patent No.: US 9,505,945 B2
(45) Date of Patent: Nov. 29, 2016

(54) SILICON CONTAINING BLOCK COPOLYMERS FOR DIRECT SELF-ASSEMBLY APPLICATION

(71) Applicant: AZ ELECTRONIC MATERIALS (LUXEMBOURG) S.A.R.L., Somerville, NJ (US)

(72) Inventors: Hengpeng Wu, Hillsborough, NJ (US); Jian Yin, Bridgewater, NJ (US); Guanyang Lin, Whitehouse Station, NJ (US); JiHoon Kim, North Wales, PA (US); Margareta Paunescu, Clinton, NJ (US)

(73) Assignee: AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 0 days.

(21) Appl. No.: 14/527,939

(22) Filed: Oct. 30, 2014

(65) Prior Publication Data
US 2016/0122579 A1  May 5, 2016

(51) Int. Cl.
| | |
|---|---|
| B05D 3/02 | (2006.01) |
| B05D 3/14 | (2006.01) |
| C08F 299/04 | (2006.01) |
| C09D 153/00 | (2006.01) |
| H01J 37/32 | (2006.01) |
| C08F 230/08 | (2006.01) |
| C08F 8/42 | (2006.01) |
| C08F 293/00 | (2006.01) |
| C08L 53/00 | (2006.01) |
| G03F 7/038 | (2006.01) |
| B82Y 30/00 | (2011.01) |

(52) U.S. Cl.
CPC ........... *C09D 153/00* (2013.01); *B05D 3/0209* (2013.01); *B05D 3/145* (2013.01); *C08F 8/42* (2013.01); *C08F 230/08* (2013.01); *C08F 293/005* (2013.01); *C08F 299/04* (2013.01); *C08L 53/005* (2013.01); *G03F 7/038* (2013.01); *H01J 37/32366* (2013.01); *B82Y 30/00* (2013.01)

(58) Field of Classification Search
CPC C08F 293/00; C08F 293/005; C08F 297/00; C09D 153/00
See application file for complete search history.

(56) References Cited

U.S. PATENT DOCUMENTS

| | | | | |
|---|---|---|---|---|
| 5,985,524 A * | 11/1999 | Allen | ................... | G03F 7/0758 430/156 |
| 6,291,696 B2 * | 9/2001 | Kinsho | ................. | C07F 7/0821 556/440 |
| 2004/0048190 A1 | 3/2004 | Momota | | |
| 2011/0272381 A1 | 11/2011 | Millward et al. | | |

(Continued)

FOREIGN PATENT DOCUMENTS

| | | |
|---|---|---|
| JP | 2002-107938 A | 4/2002 |
| WO | WO-8809527 A2 * | 12/1988 |

OTHER PUBLICATIONS

Sooriyakumaran, Ratnam et al. Proceedings of SPIE vol. 3333 pp. 219-227 (Jun. 1998).*
Zharov, Ilya et al. Chemistry of Materials vol. 14 pp. 656-663 (Jan. 2002).*
Bates et al., "Synthesis and Thin-Film Orientation of Poly(Styrene-Block-trimethylsilylisoprene)", J. Polymer Science vol. 81, pp. 290-297 (2013).
Nagaki et al., "Synthesis of Polysterenes-Poly(alkyl methacrylates) Block Copolymers via Anionic Polymerization Using an Integrated Flow Microreactor System", Macromolecules vol. 43. No. 20, pp. 8424-8429 (2010).
Nghiem et al., Well-Ordered Nanostructure SiC Ceramic Derived from Self-Assembly of Polycarbosilane-Block-Poly (methyl methacrylate) Diblock Copolymer, J. Nanosci. Nanotechnol. vol. 8 No. 10, pp. 5527-5531 (2008).

(Continued)

*Primary Examiner* — Irina S Zemel
*Assistant Examiner* — Jeffrey Lenihan
(74) *Attorney, Agent, or Firm* — Mitchell Brustein

(57) ABSTRACT

The present invention relates to a novel diblock copolymer comprising a repeat unit (1) and a repeat unit (2), where $R_1$ is hydrogen or $C_1$-$C_4$ alkyl, $R_2$ is selected from a group chosen from hydrogen, $C_1$-$C_4$ alkyl, $C_1$-$C_4$ alkoxy and halide, $R_3$ is selected from a group chosen from hydrogen, $C_1$-$C_4$ alkyl and $C_1$-$C_4$ fluoroalkyl, and $R_4$, $R_5$, $R_6$, $R_7$, $R_8$, $R_9$, $R_{10}$, $R_{11}$, and $R_{12}$ are independently chosen from a $C_1$-$C_4$ alkyl and n=1-6.

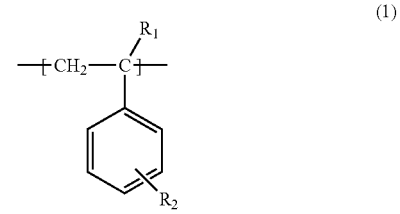

(1)

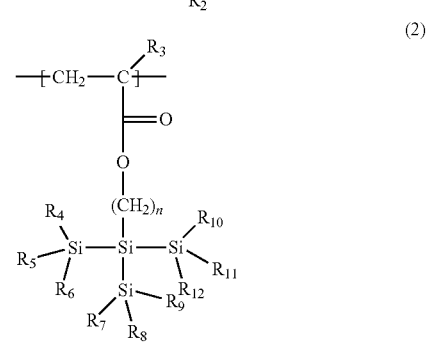

(2)

The invention also relates to a novel composition comprising the novel polymer and a solvent. The invention further relates to a process utilizing the novel composition for affecting directed self-assembly of the block copolymer.

21 Claims, 7 Drawing Sheets

(56) References Cited

U.S. PATENT DOCUMENTS

| | | |
|---|---|---|
| 2013/0209344 A1 | 8/2013 | Chang et al. |
| 2013/0209693 A1 | 8/2013 | Vogel et al. |
| 2013/0209694 A1 | 8/2013 | Chang et al. |
| 2014/0227445 A1* | 8/2014 | Trefonas .............. C09D 153/00 427/256 |

OTHER PUBLICATIONS

Stadermann et al., "Functionalized Block Copolymers for Preparation of Reactive Self-Assembled Surface Patterns", J. Polymer Science vol. 50, pp. 1351-1361 (2012).

* cited by examiner

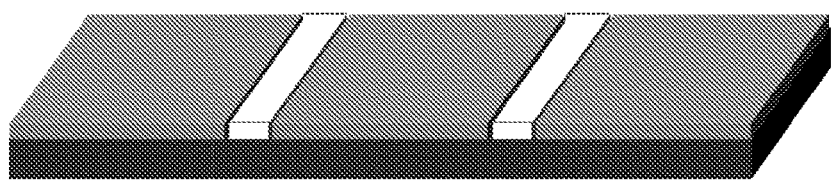
FIG. 1A
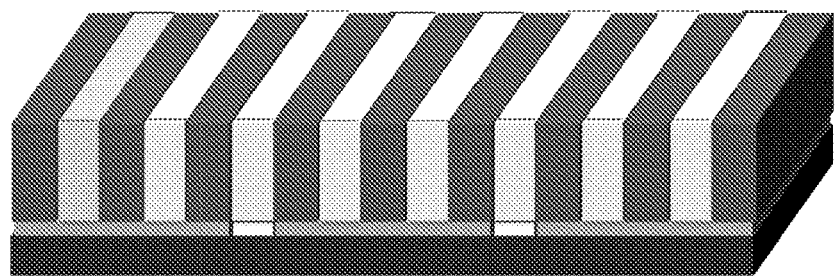
FIG. 1B
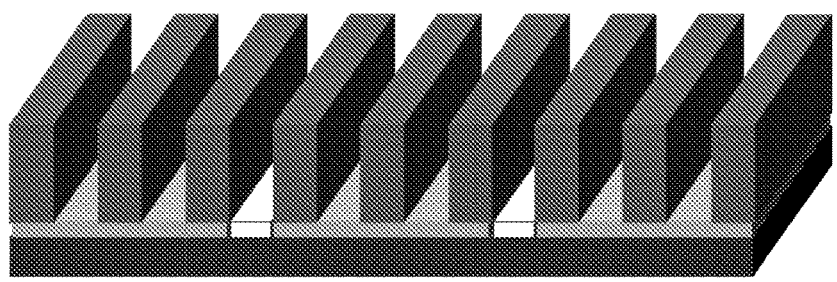
FIG. 1C
FIGS. 1A-1C

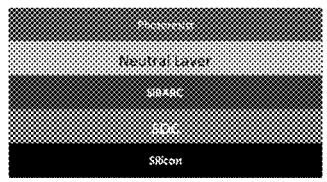
FIG. 2A
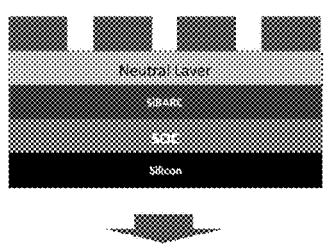
FIG. 2B
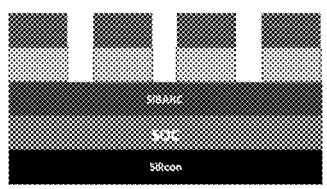
FIG. 2C
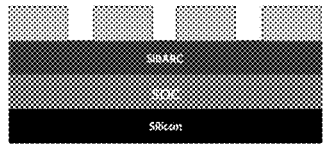
FIG. 2D
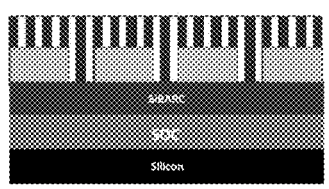
FIG. 2E
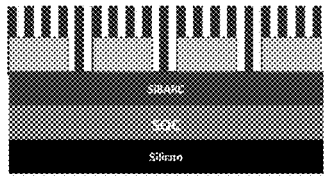
FIG. 2F
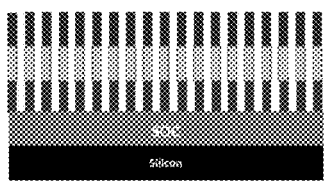
FIG. 2G
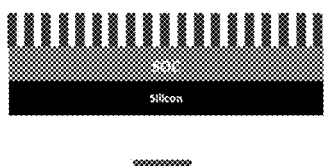
FIG. 2H
FIG. 2I
FIGS. 2A-2I

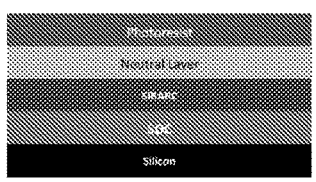
FIG. 3A
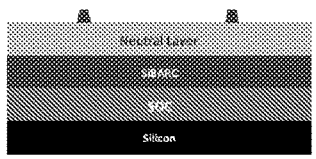
FIG. 3B
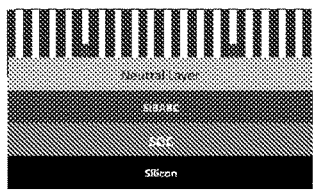
FIG. 3C
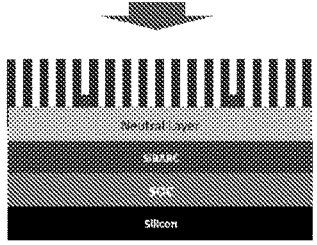
FIG. 3D
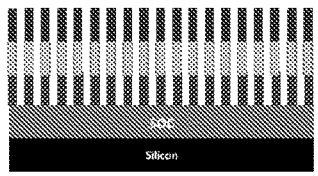
FIG. 3E
FIG. 3F
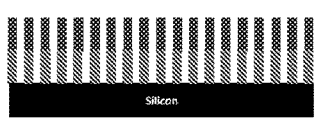
FIG. 3G
FIGS. 3A-3G

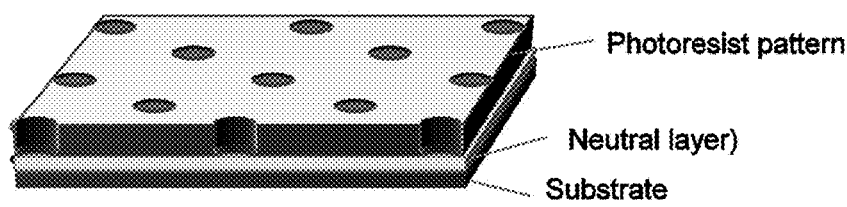
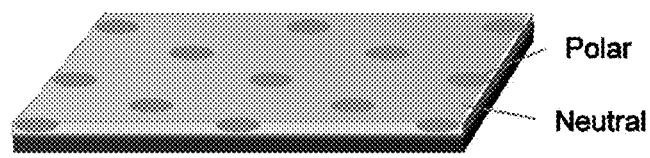
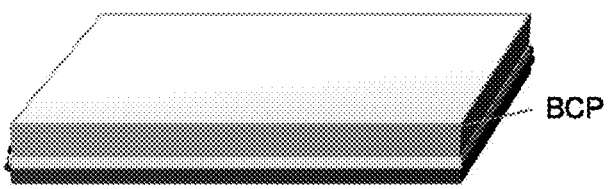
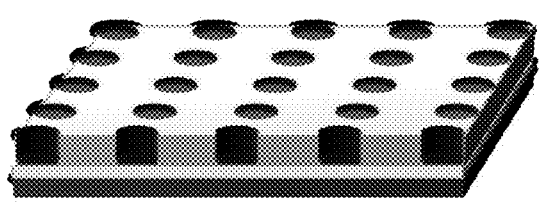
FIG. 4A
FIG. 4B
FIG. 4C
FIG. 4D
FIGS. 4A-4D

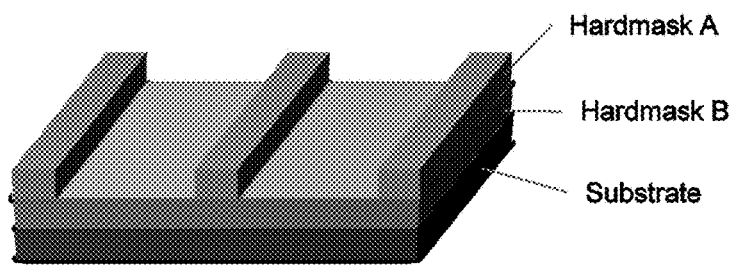
FIG. 5A
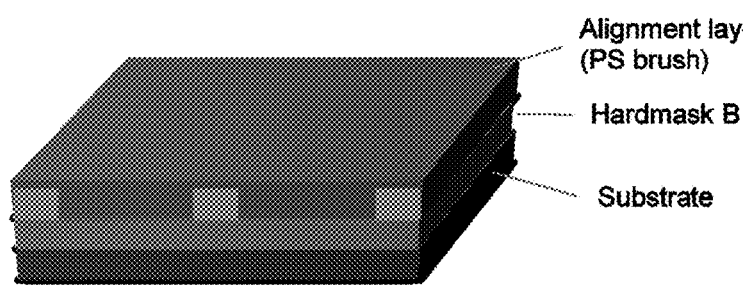
FIG. 5B
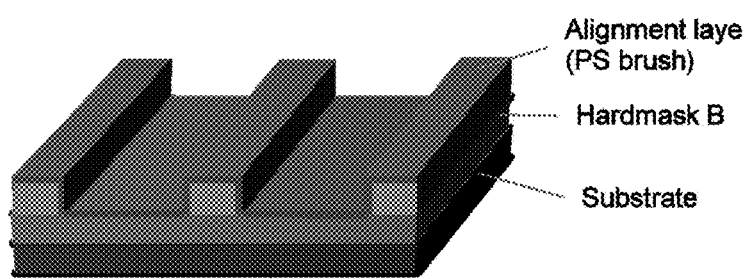
FIG. 5C
FIGS. 5A-5C

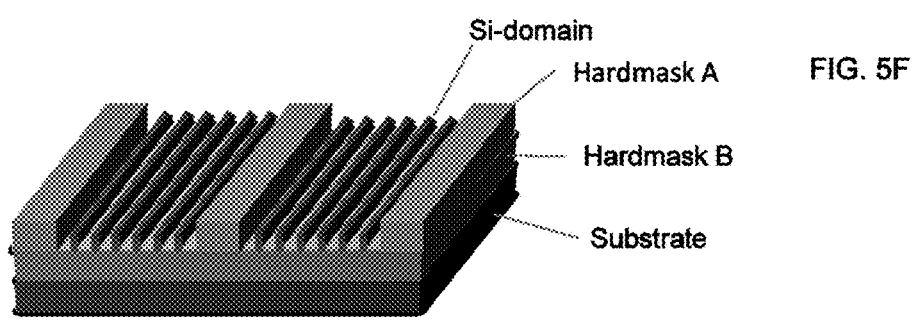
FIG. 5F
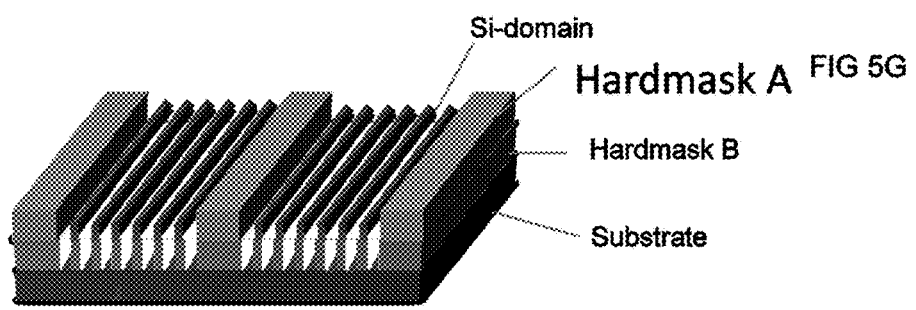
FIG. 5G
FIGS. 5F-5G

SILICON CONTAINING BLOCK COPOLYMERS FOR DIRECT SELF-ASSEMBLY APPLICATION

The invention relates to compositions and processes for producing lines and spaces formed by directed self-assembly of block copolymers (BCP) containing a silicon block. The processes are useful for fabrication of electronic devices.

Directed self-assembly of block copolymers is a method useful for generating smaller and smaller patterned features for the manufacture of microelectronic devices in which the critical dimensions (CD) of features on the order of nanoscale can be achieved. Directed self-assembly methods are desirable for extending the resolution capabilities of microlithographic technology. In a conventional lithography approach, ultraviolet (UV) radiation may be used to expose through a mask onto a photoresist layer coated on a substrate or layered substrate. Positive or negative photoresists are useful and these can also contain a refractory element such as silicon to enable dry development with conventional integrated circuit (IC) plasma processing. In a positive photoresist, UV radiation transmitted through a mask causes a photochemical reaction in the photoresist such that the exposed regions are removed with a developer solution or by conventional IC plasma processing. Conversely, in negative photoresists, UV radiation transmitted through a mask causes the regions exposed to radiation to become less removable with a developer solution or by conventional IC plasma processing. An integrated circuit feature, such as a gate, via or interconnect, is then etched into the substrate or layered substrate, and the remaining photoresist is removed. When using conventional lithographic exposure processes, the dimensions of features of the integrated circuit feature are limited. Further reduction in pattern dimensions are difficult to achieve with radiation exposure due to limitations related to aberrations, focus, proximity effects, minimum achievable exposure wavelengths and maximum achievable numerical apertures. The need for large-scale integration has led to a continued shrinking of the circuit dimensions and features in the devices. In the past, the final resolution of the features has been dependent upon the wavelength of light used to expose the photoresist, which has its own limitations. Direct assembly techniques, such as graphoepitaxy and chemoepitaxy using block copolymer imaging, are highly desirable techniques used to enhance resolution while reducing CD variation. These techniques can be employed to either enhance conventional UV lithographic techniques or to enable even higher resolution and CD control in approaches employing EUV, e-beam, deep UV or immersion lithography. The directed self-assembly block copolymer comprises a block of etch resistant copolymeric unit and a block of highly etchable copolymeric unit, which when coated, aligned and etched on a substrate give regions of very high density patterns.

In the graphoepitaxy directed self-assembly method, the block copolymers self organizes around a substrate that is pre-patterned with conventional lithography (Ultraviolet, Deep UV, e-beam, Extreme UV (EUV) exposure source) to form repeating topographical features such as a line/space (L/S) or contact hole (CH) pattern. In an example of L/S directed self-assembly array, the block copolymer can form self-aligned lamellar regions which can form parallel line-space patterns of different pitches in the trenches between pre-patterned lines, thus enhancing pattern resolution by subdividing the space in the trench between the topographical lines into finer patterns. For example, a diblock copolymer which is capable of microphase separation and comprises a block rich in carbon (such as styrene or containing some other element like Si, Ge, Ti) which is resistant to plasma etch, and a block which is highly plasma etchable or removable, can provide a high resolution pattern definition. Examples of highly etchable blocks can comprise monomers which are rich in oxygen and which do not contain refractory elements, and are capable of forming blocks which are highly etchable, such as methyl methacrylate. The plasma etch gases used in the etching process of defining the self-assembly pattern typically are those used in processes to make integrated circuits (IC). In this manner very fine patterns can be created on typical IC substrates compared to conventional lithographic techniques, thus achieving pattern multiplication. Similarly, features such as contact holes can be made denser by using graphoepitaxy in which a suitable block copolymer arranges itself by directed self-assembly around an array of contact holes or posts defined by conventional lithography, thus forming a denser array of regions of etchable and etch resistant domains which when etched give rise to a denser array of contact holes. Consequently, graphoepitaxy has the potential to offer both pattern rectification and pattern multiplication.

In chemical epitaxy or pinning chemical epitaxy, the self-assembly of the block copolymer is formed around a surface that has regions of differing chemical affinity but no or very slight topography to guide the self-assembly process. For example, the surface of a substrate could be patterned with conventional lithography (UV, Deep UV, e-beam EUV) to create surfaces of different chemical affinity in a line and space (L/S) pattern in which exposed areas whose surface chemistry had been modified by irradiation alternate with areas which are unexposed and show no chemical change. These areas present no topographical difference, but do present a surface chemical difference or pinning to direct self-assembly of block copolymer segments. Specifically, the directed self-assembly of a block copolymer whose block segments contain etch resistant (such as styrene repeat unit) and rapidly etching repeat units (such as methyl methacrylate repeat units) would allow precise placement of etch resistant block segments and highly etchable block segments over the pattern. This technique allows for the precise placement of these block copolymers and the subsequent pattern transfer of the pattern into a substrate after plasma or wet etch processing. Chemical epitaxy has the advantage that it can be fined tuned by changes in chemical differences to help improve line-edge roughness and CD control, thus allowing for pattern rectification. Other types of patterns such as repeating contact holes (CH) arrays could also be pattern rectified using chemoepitaxy.

Neutral layers are layers on a substrate or the surface of a treated substrate which have no affinity for either of the block segment of a block copolymer employed in directed self-assembly. In the graphoepitaxy method of directed self-assembly of block copolymer, neutral layers are useful as they allow the proper placement or orientation of block polymer segments for directed self-assembly which leads to proper placement of etch resistant block polymer segments and highly etchable block polymer segments relative to the substrate. For instance, in surfaces containing line and space features which have been defined by conventional radiation lithography, a neutral layer allows block segments to be oriented so that the block segments are oriented perpendicular to the surface of the substrates, an orientation which is ideal for both pattern rectification and pattern multiplication depending on the length of the block segments in the block copolymer as related to the length between the lines defined by conventional lithography.

The use of diblock copolymer of styrene and dimethylsiloxane having a high silicon content in a direct self-assembly process, where assembly of the high silicon contents enables plasma etch transfer of the self-assembled pattern into a substrate, requires either the use of solvent annealing (US2011/0272381) to lower the annealing temperatures needed for self-assembly of the block domains or alternatively processing at high temperature (275-350° C.) under gaseous conditions of low oxygen in which the oxygen content is equal or less than 7.5 ppm (US2013/0209344). Consequently, there is a need for a block copolymer containing a high silicon domain which can be processed at lower temperatures particularly when doing so in air.

When using a Graphoepitaxy approach to define an array of lines and spaces or contact holes or via's using a conventional block copolymer materials, such as block copolymer of styrene and dimethylsiloxane, it is necessary to employ high temperatures or annealing with solvent. The present invention describes a novel block copolymer containing a high silicon content block which can be annealed at a lower range of temperature between 120° C. and 250° C. in air without the need of low oxygen or solvent annealing to affect the directed self-assembly needed which is required to create silicon rich and silicon free domains which may be used to pattern transfer lines and spaces, contact hole, vias or other features into a substrate. The invention also relates to compositions comprising this novel polymer and a solvent and processes to form a coating of the novel block polymer on a substrate.

The present invention also relates to directed self-assembly processes for making lines and spaces, contact holes vias or other features into a substrate by using a composition containing the novel polymer of this invention.

BRIEF DESCRIPTION OF DRAWINGS

FIGS. 1a-1c show a self-alignment process for the novel block copolymer which has a ratio of repeat unit (1) to that of repeat unit (2) of 1.2 to 0.8 and which orients perpendicular to a neutral layer.

FIGS. 2a-2i show a process for negative tone line multiplication for the novel block copolymer which has a ratio of repeat unit (1) to that of repeat unit (2) of 1.2 to 0.8 and which orients perpendicular to a neutral layer.

FIGS. 3a-3g show a process for positive tone multiplication for the novel block copolymer which has a ratio of repeat unit (1) to that of repeat unit (2) of 1.2 to 0.8 and which orients perpendicular to a neutral layer.

FIGS. 4a-4d show a contact hole multiplication process for the novel block copolymer which has a ratio of repeat unit (1) to that of repeat unit (2) of 1.2 to 0.8 and which orients perpendicular to a neutral layer.

FIGS. 5a-5g shows a cylinder graphoepitaxy multiplication process for the novel block copolymer which has a ratio of repeat unit (1) to that of repeat unit (2) of 5.3 to 8 and which orients parallel to a substrate.

SUMMARY OF INVENTION

Figure 5D:
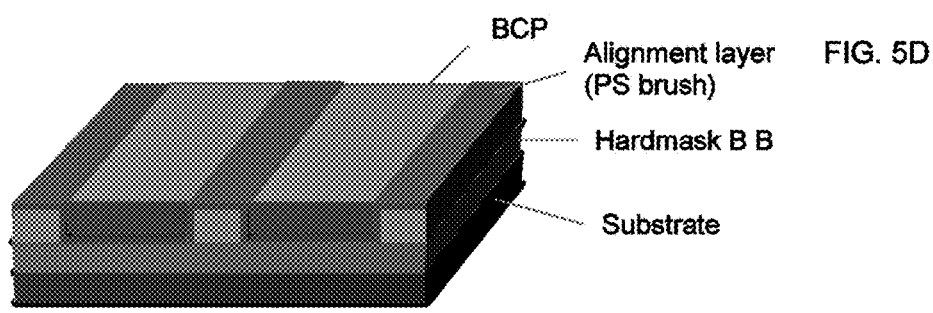

The present invention relates to a block copolymer comprising a repeat unit (1) and repeat unit (2), where $R_1$ is hydrogen or $C_1$-$C_4$ alkyl, $R_2$ is hydrogen, $C_1$-$C_4$ alkyl, $C_1$-$C_4$ alkoxy or halide, $R_3$ is hydrogen, $C_1$-$C_4$ alkyl, or $C_1$-$C_4$ fluoroalkyl, and $R_4$, $R_5$, $R_6$, $R_7$, $R_8$, $R_9$, $R_{10}$, $R_{11}$, and $R_{12}$ are independently chosen from $C_1$-$C_4$ alkyl and n=1-6.

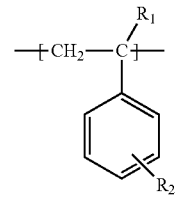

(1)

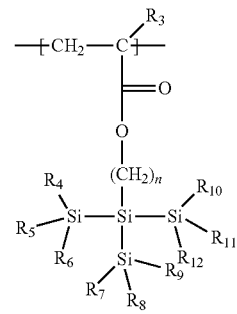

(2)

The present invention also relates to a novel composition comprising the novel block copolymer and a solvent. The present invention further relates to a process for employing this novel composition to affect directed self-assembly on a substrate to form silicon rich and silicon poor domains which is used to develop the self-assembled polymer structure to form a pattern array.

DETAILED DESCRIPTION OF THE INVENTION

As used herein, alkyl refers to saturated hydrocarbon groups which can be linear or branched (e.g. methyl, ethyl, propyl, isopropyl, tert-butyl and the like) or cycloalkyl referring to a hydrocarbon containing one saturated cycle (e.g. cyclohexyl, cyclopropyl, cyclopentyl and the like), fluoroalkyl refers to a linear or branched saturated alkyl group in which all the hydrogens have been replaced by fluorine, cyclofluoroalkyl refers to a cycloalkyl group in which all the hydrogens have been replaced by fluorine. The term "-b-" refers to "-block-" and designates monomer repeat units that form block copolymer.

The present invention relates to a novel block copolymer comprising a repeat unit (1) and a repeat unit (2), where $R_1$ is hydrogen or $C_1$-$C_4$ alkyl, $R_2$ is selected from a group chosen from hydrogen, $C_1$-$C_4$ alkyl, $C_1$-$C_4$ alkoxy or halide, $R_3$ is hydrogen, $C_1$-$C_4$ alkyl, or a $C_1$-$C_4$ fluoroalkyl, and $R_4$, $R_5$, $R_6$, $R_7$, $R_8$, $R_9$, $R_{10}$, $R_{11}$, and $R_{12}$ are independently chosen from $C_1$-$C_4$ alkyl and n=1-6.

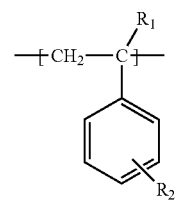

(1)

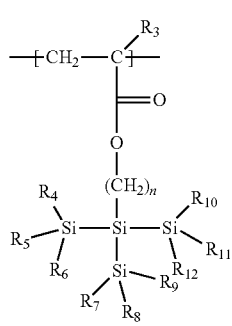

(2)

One aspect of this invention is where the block copolymer is a diblock copolymer.

In another embodiment of this invention, particularly useful for a cylinder graphoepitaxy process in which the silicon rich domains self-assemble as cylinder domains parallel to the substrate along guiding graphoepitaxy lines, the novel block copolymer has a ratio of repeat unit (1) to that of repeat unit (2) in the range of about 5.3 to about 8.0. Another aspect of the invention is where the polymer has a Mn of 28,000 to 75,000 g/mole, and a polydispersity of 1.0 to 1.2.

In a further embodiment of this aspect of the invention, the ratio of repeat unit (1) to that of repeat unit (2) is in the range of 5.3 to 8.0. In still another aspect of this invention the polymer has a Mn of 28,000 to 46,000 g/mole and a polydispersity of 1.0 to 1.2.

In still another embodiment the ratio of repeat unit (1) to that of repeat unit (2) is in the range of 7.3 to 6.0. In another aspect of this embodiment the polymer has a Mn of 28,000 to 46,000 g/mole. In still another embodiment the polymer also has a polydispersity of 1.0 to 1.2.

In still another embodiment of this invention the block copolymer has a ratio of repeat units (1) to that of repeat unit (2) the range of 5.3 to 8.0 and where R1 is hydrogen, $R_2$ is hydrogen or a $C_1$-$C_4$ alkyl, $R_3$ is a $C_1$-$C_4$ alkyl or a $C_1$-$C_4$ fluoroalkyl, and $R_4$, $R_5$, $R_6$, $R_7$, $R_8$, $R_9$, $R_{10}$, $R_{11}$, and $R_{12}$ are each a methyl and n=2-6. In a further embodiment of this invention $R_1$ is hydrogen, $R_2$ is hydrogen, $R_3$ is a $C_1$-$C_4$ alkyl, and $R_4$, $R_5$, $R_6$, $R_7$, $R_8$, $R_9$, $R_{10}$, $R_{11}$, and $R_{12}$ are each methyl and n=2-6. In a preferred embodiment of this invention $R_1$ is hydrogen, $R_2$ is hydrogen, $R_3$ is a methyl, and $R_4$, $R_5$, $R_6$, $R_7$, $R_8$, $R_9$, $R_{10}$, $R_{11}$, and $R_{12}$ are each methyl and n=3. In another aspect of this invention, the polymer has the above described restriction in substituents, a more narrow range of the repeat unit (1) to that of repeat unit (2) of 7.3 to 6.0 along with an Mn of 28,000 to 46,000 g/mole, and a polydispersity of 1.0 to 1.2.

In another embodiment useful for conventional graphoepitaxy or chemoepitaxy in which the block copolymer self-assembles as cylinders perpendicular to the substrate along guiding graphoepitaxy lines, the novel block copolymer has a molar ratio of repeat unit (1) to repeat unit (2) of 1.2 to 0.8, an Mn of 28,000 to 75,000 g/mole, and a polydispersity of 1.0 to 1.2. In another embodiment of this, the molar ratio of repeat unit (1) to that repeat unit (2) is 1.2 to 0.8 and the polymer has a Mn of 28,000 to 46,000 g/mole and the polydispersity is 1.0 to 1.2. In a further embodiment of this, the molar ratio of repeat unit (1) to that of repeat unit (2) is from 0.9 to 1.1 and the polymer has a Mn of 28,000 to 46,000 g/mole and a polydispersity of 1.0 to 1.2.

In still another embodiment of this invention the block copolymer has a ratio of repeat units (1) to that of repeat unit (2) of 1.2 to 0.8, and the repeat units (1) and (2) are ones in which $R_1$ is hydrogen, $R_2$ is hydrogen or a $C_1$-$C_4$ alkyl, $R_3$ is a $C_1$-$C_4$ alkyl or a $C_1$-$C_4$ fluoroalkyl, and $R_4$, $R_5$, $R_6$, $R_7$, $R_8$, $R_9$, $R_{10}$, $R_{11}$, and $R_{12}$ are methyls and n=2-6. In a further embodiment of this invention $R_1$ is hydrogen, $R_2$ is hydrogen, $R_3$ is a $C_1$-$C_4$ alkyl, and $R_4$, $R_5$, $R_6$, $R_7$, $R_8$, $R_9$, $R_{10}$, $R_{11}$, and $R_{12}$ are methyls and n=2-6. In another embodiment of this invention $R_1$ is hydrogen, $R_2$ is hydrogen, $R_3$ is a methyl, and $R_4$, $R_5$, $R_6$, $R_7$, $R_8$, $R_9$, $R_{10}$, $R_{11}$, and $R_{12}$ are methyls and n=3.

In yet another embodiment of the present invention the polymer has a molar ratio of repeat unit (1) to that of repeat unit (2) from 1.2 to 0.8 and also has the above restriction in substituents along with the above described embodiment of Mn and polydispersity.

The novel block copolymer of this invention comprising repeat unit (1) and repeat unit (2) may be made with a living anionic polymerization respectively from the corresponding monomers I and monomer II using conventional block copolymerization techniques applicable to the forming block copolymers of styrene and alkyl methacrylate (see Nagaki, Aiichiro; Miyazaki, Atsuo; Yoshida, Jun-ichi from Macromolecules (Washington, D.C., United States) (2010), 43(20), 8424-8429 and reference therein).

Alternatively, the block copolymer of this invention may be made by polymer modification of another block copolymer precursor. Scheme 1 outlines a non-limiting example of such a polymer modification which employs as starting material a block copolymer of tert-butyl methacrylate and styrene which yield the embodiment of the present invention where the block copolymer has a molar ratio of repeat unit (1) to repeat unit (2) of 0.8 to 1.2 or 5.3 to 8.0 and where $R_1$ is hydrogen, $R_2$ is hydrogen, $R_3$ is a methyl, and $R_4$, $R_5$, $R_6$, $R_7$, $R_8$, $R_9$, $R_{10}$, $R_{11}$, and $R_{12}$ are each methyl and n=3.

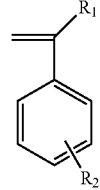

Monomer I

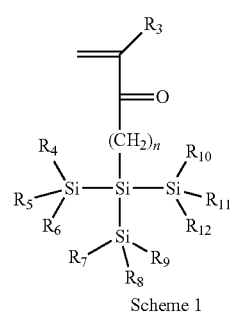

Monomer II

Scheme 1

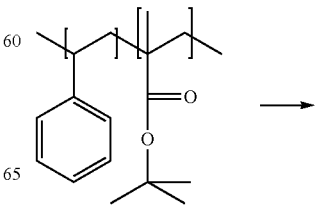

-continued

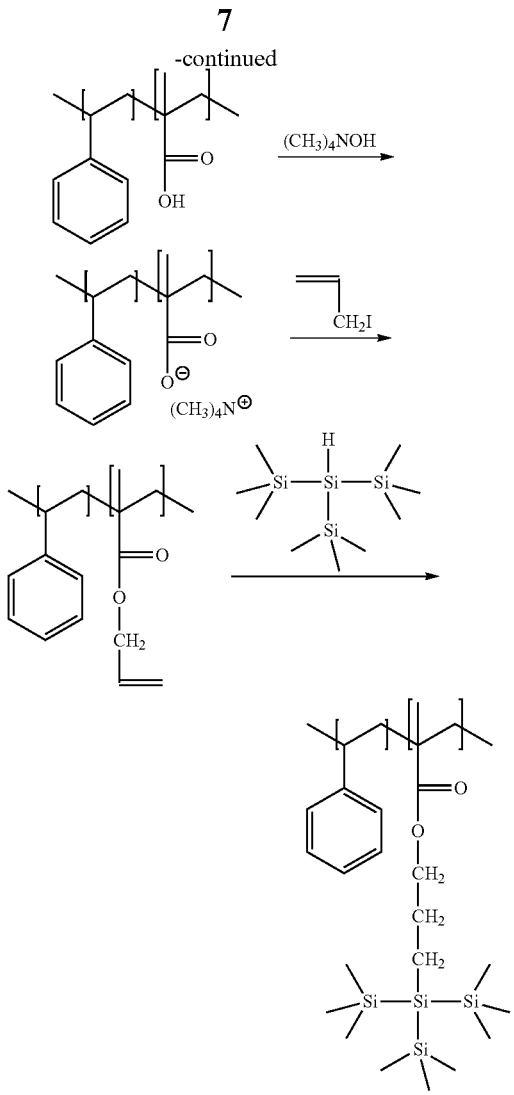

The novel block copolymer of the present invention is formulated in a composition comprising the novel block copolymer and a solvent.

Examples of suitable solvents are conventional spin casting solvents based upon esters, alcoholic esters, ethers, alcoholic ether, lactones or mixtures of these.

More specific examples are 1,2-propanediol alkyl ethers where the alkyl group is a $C_1$-$C_4$ alkyl moiety; alkylcarboxylate ester of 1,2-propanediol alkyl ethers where the alkyl group is a $C_1$-$C_4$ alkyl moiety; alkyl acetates where the alkyl group is a $C_1$-$C_4$ alkyl moiety; alkyl benzenes where the alkyl group is a $C_1$-$C_4$ alkyl moiety, $C_8$-$C_{12}$ alkanes, $C_6$-$C_{12}$ cycloalkanes, and mixtures thereof and the like.

Other specific examples are solvents such as propylene glycol methyl ether acetate, propyleneglycol methyl ether, n-butyl acetate, gamma-butyrolactone, anisol, 2-heptanone, xylene, anisole, decalin, cyclohexane, cyclohexene, methylcyclohexane, ethylcyclohexane, limonene, hexane, octane, nonane, decane, or mixtures of these.

The novel block copolymer of the present invention is dissolved in the solvent(s) as a solution, where the block copolymer has a concentration in the solvent between 0.5 to 5 wt % of the total composition. In another embodiment the concentration of the block copolymer is between 0.5 to 1.5 wt % of the total composition.

The block copolymer composition can comprise additional components and/or additives selected from the group consisting of: inorganic-containing polymers; additives including small molecules, inorganic-containing molecules, surfactants, photoacid generators, thermal acid generators, quenchers, hardeners, cross-linkers, chain extenders, and the like; and combinations comprising at least one of the foregoing, wherein one or more of the additional components and/or additives co-assemble with the block copolymer to form the block copolymer assembly.

The composition may further comprise additives such as surfactants.

A general process for directed self-assembly useful for patterning which employs the novel block copolymer formulation described above comprises steps i) to iv); wherein,
  i) coating the block copolymer composition over a substrate to form a film;
  ii) applying a flow bake to the block copolymer film to remove solvent and to optionally conformably coat any topography in the substrate;
  iii) applying an annealing bake to affect self-assembly of the block copolymer; and,
  iv) developing the self assembled polymer structure to form a pattern array.

The application of the novel block copolymer in step i) onto a substrate is done by spinning techniques (including spin drying). Self-directed domain formation can occur during the flow baking, annealing, or during a combination of one or more of these operations (steps ii and iii).

In one embodiment, the film spun from the novel block copolymer is subjected to a flow bake (step ii) in the range of between 100° C. and 160 C in air followed by an annealing bake (step iii) in the range of 120° C. and 250° C. also done in air without need for solvent annealing or a low oxygen environment. In another embodiment the annealing bake in air is done in the range of between 180° C. and 250° C. also without the need of solvent annealing or a low oxygen environment.

Alternatively, the annealing (step iii) can be conducted between 120° C. and 300° C. and is done in nitrogen without need of solvent annealing. In another embodiment the annealing bake in air is done between 180° C. and 300° C. without need of solvent annealing.

The present invention further relates to an embodiment of the novel process which employs the novel block copolymer in which the molar ratio in the novel block copolymer of repeat unit (1) to repeat unit (2) is between 1.2 to 0.8 (as described above in all its possible embodiments) and where the oriented block copolymer assembly is prepared by the above process, having microphase-separated domains that comprise cylindrical microdomains oriented perpendicular to the neutral surface because neither domain has any preference to associate with the neutral layer. The microphase-separated domains have lamellar domains oriented perpendicular to the neutral surface, which provide parallel line/space patterns in the block copolymer assembly. The domains, so oriented, are thermally stable under further processing conditions. Thus, after coating a layer of the novel block copolymer and assembly including, baking and/or annealing, the domains of the block copolymer will form on and remain perpendicular to the neutral surface, giving highly resistant and highly etchable regions on the surface of the substrate, which can be further pattern transferred in the substrate layers. The directed self-assembled block copolymer pattern is transferred into the underlying substrate using known techniques. In one example wet or plasma etching could be used with optional UV exposure.

Wet etching could be with acetic acid. Standard plasma etch process, such as a plasma comprising oxygen may be used; additionally argon, carbon monoxide, carbon dioxide, $CF_4$, $CHF_3$, may be present in the plasma. FIGS. 1a-1c illustrates a chemoepitaxy process where the neutral layer is modified to define a patterned chemical affinity, FIG. 1a. The block copolymer is then coated over a chemically modified neutral layer and annealed to form domains perpendicular to the substrate surface, FIG. 1b. One of the domains is then removed to form a pattern on the surface of the substrate, FIG. 1c.

FIG. 2a-FIG. 2i illustrates a novel process for forming line multiplication using a negative tone process. A multilayer stack is formed on a substrate in FIG. 2a, where the stack comprises a substrate comprising a high carbon underlayer and a silicon antireflective coating layer, a crosslinked neutral layer and a photoresist layer. Any substrate may be used. Any neutral layer which is resistant to lithographic processes and maintains neutrality after crosslinking may be used. The photoresist may be any that is available such as 193 nm photoresist, immersion 193 nm photoresist, e beam photoresist, EUV photoresist, 248 nm photoresist, broadband, 365 nm, 436 nm, etc. The photoresist layer is imaged to form a pattern using conventional techniques. A negative tone photoresist may be used or a positive tone photoresist that uses an organic solvent to develop away the unexposed regions to form very narrow trenches may be used, as shown in FIG. 2b. The novel underlayer is treated to form a pinning surface with a specific chemical affinity to one of the blocks of the novel block copolymer which has a molar ratio of repeat unit (1) to that of repeat unit (2) of 1.2 to 0.8 and which orient perpendicular to a neutral layer, using techniques such as plasma etching to remove the layer, plasma etching to modify the surface of the layer, or chemically treating the layer by further deposition of a material or any other pinning methods. A plasma comprising oxygen may be used to remove the neutral layer, as shown in FIG. 2c. The photoresist is then stripped away using solvent stripper or plasma etching, as shown in FIG. 2d. Solvents such as any organic solvents known for removing photoresists may be used, such as 1-Methoxy-2-propanol acetate (PGMEA), 1-Methoxy-2-propanol (PGME), ethyl lactate, etc. The photoresist may also be removed by developing the photoresist pattern in aqueous alkaline developer as commonly used in removing exposed photoresists. The neutral layer on the substrate still maintains its neutrality after the photoresist processing steps. Over the patterned neutral layer, FIG. 2e, the composition comprising the novel block copolymer is coated and treated (such as annealing) to form a self-directed alignment pattern of alternating segments of the novel block copolymer. A layer which is neutral is required to cause the alignment of the novel block copolymer to give regions of high etch resistance and regions of low etch resistance, such that pattern multiplication can be achieved, as shown in FIG. 1e; if the neutral layer was not sufficiently neutral then an undesirable orientation parallel to the surface would be achieved. A subsequent etch then removes the highly etchable blocks of the block copolymer, leaving a patterned surface with very high resolution, as shown in FIG. 2f. Typical etch to remove one of the blocks would be a wet or plasma etch as described previously. The pattern may then be transferred into the lower stack layers by plasma etching, as shown in FIG. 2g-2i, using etchants for the antireflective coating stack. Typical etch would be a plasma etch dependent on the substrate.

FIGS. 3a to 3g illustrates a novel process for forming line multiplication using a positive tone process. A multilayer stack is formed on a substrate neutral layer and a photoresist layer in FIG. 3a, where the substrate comprises a high carbon underlayer and a silicon antireflective coating layer. Any neutral layer which is resistant to lithographic processes and maintains neutrality after crosslinking may be used. The photoresist may be any that are available such as 193 nm photoresist, immersion 193 nm photoresist, e beam photoresist, EUV photoresist, 248 nm photoresist, etc. The photoresist layer is imaged to form a pattern using conventional techniques. A positive tone photoresist is used to form fine photoresist lines, as shown in FIG. 3b. In some cases the photoresist is overexposed, that is given a high energy dose, to form very fine pattern. The very fine photoresist pattern over the novel neutral underlayer is used to form a self-aligned pattern using the novel block copolymer which has a molar ratio of repeat unit (1) to that of repeat unit (2) of 1.2 to 0.8 and which orient perpendicular to a neutral layer. The composition comprising the novel block copolymer is coated and treated (such as annealing) to form a self directed alignment pattern of alternating segments of the block copolymer. A layer which is neutral is required to cause the alignment of the block copolymer to give regions of high etch resistance and regions of low etch resistance, such that pattern multiplication can be achieved, as shown in FIG. 3c; if the neutral layer was not sufficiently neutral then an undesirable orientation perpendicular to one shown would be achieved. A subsequent etch then removes the highly etchable blocks of the novel block copolymer, leaving a patterned surface with very high resolution, as shown in FIG. 3d. Typical etch would be a wet or plasma etch as described previously. The pattern may then be transferred into the lower stack layers by plasma etching, as shown in FIGS. 3e-g. Typical etch would be plasma etch dependent on the substrate.

FIG. 4a-4d illustrates a novel process for forming contact hole multiplication using a chemoepitaxy process. A multilayer stack is formed on a substrate, where the stack comprises a substrate (such as a silicon antireflective coating layer, a titanium antireflective coating, silicon oxide, etc,), a neutral layer and a photoresist layer. A neutral layer which is resistant to lithographic processes and maintains neutrality after crosslinking may be used. The photoresist may be any that are available such as 193 nm photoresist, immersion 193 nm photoresist, e beam photoresist, EUV photoresist, 248 nm photoresist, etc. The photoresist layer is imaged to form a pattern using conventional techniques, FIG. 4a. The underlayer is treated to form a pinning surface using techniques such as plasma etching to remove the layer, plasma etching to modify the surface of the layer, or chemically treating the layer by further deposition of a material or any other pinning methods. A plasma comprising oxygen may be used to remove the neutral layer, as shown in FIG. 4b. The photoresist is then stripped away using solvent stripper or plasma etching. Solvents such as any organic solvents known for removing photoresists may be used, such as PGMEA, PGME, ethyl lactate, etc. may be used. The photoresist may also be used by developing the pattern in aqueous alkaline developer used in removing exposed photoresists. The neutral layer on the substrate still maintains its neutrality after the photoresist processing steps. Over the patterned neutral layer, FIG. 4c, the novel composition comprising novel block copolymer which has a molar ratio of repeat unit (1) to that of repeat unit (2) of 1.2 to 0.8 and which orient perpendicular to a neutral layer is coated and treated (such as annealing) to form a self-directed alignment contact hole pattern of alternating segments of the block copolymer. A layer which remains neutral is required to cause the desired orientation of the block copolymer to give regions of high etch resistance and regions of low etch resistance, such that pattern multiplication can be achieved; if the neutral layer was not sufficiently neutral then an undesirable orientation perpendicular to one shown would be achieved. A subsequent etch then removes the highly etchable blocks of the novel block copolymer, leaving a patterned surface with very high resolution, as shown in FIG. 4d. Typical etch would be a wet or plasma etch as described previously. The pattern may then be transferred in the lower stack layers by plasma etching. Typical etch would be plasma etch dependent on the substrate. This process can be used for both pattern rectification and pattern pitch frequency multiplication.

Figure 5E:
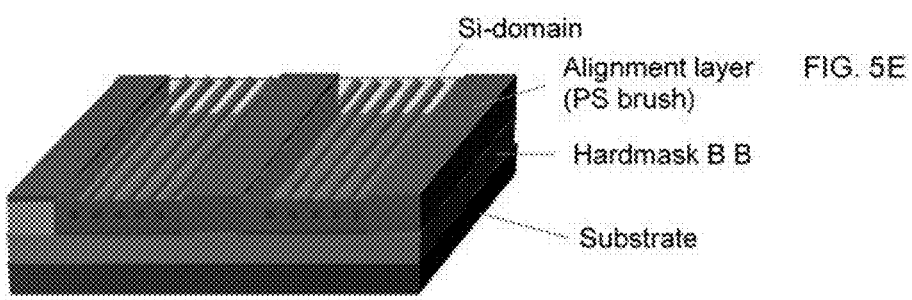

Another aspect of this invention is where, the general process for directed self-assembly useful for patterning which employs the novel block copolymer formulation described above comprises steps i) to iv) and where further the molar ratio in the novel block copolymer of repeat unit (1) to repeat unit (2) is between 5.3 to 8. In this instance however an oriented block copolymer assembly is prepared where the microphase-separated domains that comprise cylindrical microdomains are oriented parallel to the substrate because the silicon rich domain has a preference to associate with the substrate. These microphase-separated domains having cylindrical domains oriented parallel to the substrate surface provide parallel line/space patterns during the block copolymer self-assembly. The domains, so oriented, are thermally stable under further processing conditions. Thus, after coating a layer of the novel block copolymer and self-assembly including, baking and/or annealing, the domains of the block copolymer will form on and remain parallel to the neutral surface, giving highly etch resistant and highly etchable regions on the surface of the substrate, which can be further pattern transferred in the substrate layers. The directed self-assembled block copolymer pattern is transferred into the underlying substrate using known techniques. In one example wet or plasma etching could be used with optional UV exposure. Wet etching could be with acetic acid. Standard plasma etch process, such as a plasma comprising oxygen may be used; additionally argon, carbon monoxide, carbon dioxide, $CF_4$, $CHF_3$, may be present in the plasma. A specific example of a graphoepitaxy approach shown in FIG. 5 may be employed to delineate lines and spaces by having a pattern previously formed by a resist in which the resist pattern surface has been treated with a hydroxy terminated polystyrene to form a polymer brush surface.

FIGS. 5a to 5g illustrates a novel process for forming line multiplication using graphoepitaxial directed self-assembly (DSA) process. Graphoepitaxial pre-pattern structure comprises a multilayer stack (Substrate and Hardmask B) and topographical guiding stripe patterns (Hardmask A) on it in FIG. 5a, where the multilayer stack include materials such as a high carbon underlayer, silicon antireflective coating layer, Silicon Oxide, Silicon Nitride, Silicon Oxynitride and so on. Guiding topographical structure is made from same kind of material for multilayer stack or photoresist. To align parallel cylindrical BCP to the substrate in the trench, brush material (Alignment layer) which has similar surface energy to one of domain in the BCP is coated and baked in as in FIG. 5b and non-grafted excess brush materials are rinsed with organic solvents such as PGMEA, PGME, ethyl lactate, etc which retains topographical pre-pattern structure in FIG. 5c. Then the novel block copolymer solution is coated on chemically treated topographical pre-pattern in FIG. 5d and annealed to form cylindrical morphology parallel to the substrate in FIG. 5e. Lower etch resistant BCP domain, which is typically non-silicon containing BCP domain, and thin brush layers except the area below the silicon containing domain are then removed to generate line patterns on the surface of the substrate in FIG. 5f. Then, line patterns are transferred into underneath Hardmask B and substrate consecutively by plasma etching as in FIG. 5g.

In the above processes, any type of substrate may be used. As an example, a substrate which has a coating of high carbon underlayer and a silicon antireflective coating may be used as a substrate. The high carbon underlayer can have coating thickness of about 20 nm to about 2 microns. Over this is coated a silicon antireflective coating of about 10 nm to about 100 nm. In instances where an orientation of the self assembled cylinder of the novel block copolymer perpendicular to the substrate is desired a neutral layer may be employed.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The molecular weight of the polymers was measured with a Gel Permeation Chromatograph. Poly(styrene-block-tert-butylmethacrylate) (PS-b-PtBMA) was bought from Polymer Source Inc. 124 Avro Street, Dorval (Montreal), Quebec H9P 2X8, Canada. All other chemicals were obtained from the Aldrich Chemical Company (Sigma-Aldrich Corp St. Louis, Mo., USA).

Spinning and baking of films was done with Laurel WS-650-23B spin coater and a Tokyo Electron Ltd. Clean Track ACT-8. Nordson (300 Nordson Dr. M/S 47 Amherst, Ohio 44001 U.S.A.) MARCH etcher was used for plasma etching of non-Si containing domain. Top down and cross section images were taken on AMAT (Applied Materials, Inc. 3050 Bowers Avenue P.O. Box 58039 Santa Clara, Calif. 95054-3299 U.S.A.) NanoSEM 3D and Hitachi (Hitachi High Technologies America Inc. 10 North Martingale Road, Suite 500 Schaumburg, Ill. 60173-2295) S-5500, respectively.

Example 1

Hydrolysis of PS-b-PtBMA to Prepare poly(styrene-block-methacrylic acid (PS-b-PMAA)

20.14 g of PS-b-PtBMA (Mn for PS block was 29290 g/mol by GPC, Mn for PtBMA was 6000 g/mol estimated by NMR and PDI was 1.04) was dissolved in 320 g of 1,4-dioxane in a 500 ml flask with a magnetic stirring bar and a cold water condenser. To this solution was added 60 ml of 4M HCl in dioxane and 15 g of delozined (DI) water. The flask was immersed into a 90° C. oil bath and hydrolysis was carried out at this temperature until Fourier Transform Infrared (FTIR) spectra showed no tert-butyl group CH peak at 1366 cm$^{-1}$. The reaction solution was allowed to cool to room temperature and slowly poured into DI water under stirring. The resultant white polymer was isolated by filtering and washed thoroughly with DI water and methanol.

Finally the polymer was dried in vacuum until constant weight to obtain 17 g PS-b-PMAA.

Example 2

Preparation of PS-b-PAMA
(Poly(styrene-block-allyl methacrylate))

12 g of PS-b-PMAA prepared above was dissolved in 110 g of 1,4-dioxane and 36 g of THF in a 250 ml flask with a magnetic bar. To this solution was added 6 g of tetramethylammonium pentahydrate dissolved in 30 g of methanol. After the mixture was stirred at room temperature for 7 hours, 13 g of allyl iodide was added. The reaction mixture was stirred at room temperature for 2 days. The formed tetramethylammonium iodide was filtered out. The filtrate was poured into methanol under stirring. The resultant polymer was isolated by filtering and washed thoroughly with methanol. After drying in vacuum, 11.2 g of PS-b-PAMA was obtained. The polymer had a Mw of 34484 g/mol, a Mn of 33091 g/mol and PDI of 1.04.

Example 3

Preparation of Silicon Containing Block Copolymer poly(styrene-block-3-(tris(trimethylsilyl)silyl)propyl methacrylate) (SiBCP)

2.3 g of PS-b-PAMA prepared above was dissolved in toluene to prepare a 10 wt % solution. 3.25 g of 5 wt % dodecanethiol in toluene and 11.6 g of tris(trimethylsilyl)silane were added. After the mixture was cooled to 0° C. in an ice bath, 3.2 g of 1M triethylborane in hexane was added in small portions over 2 hrs. After addition, the ice bath was removed and the reaction mixture was stirred at room temperature overnight. The mixture was poured into methanol under stirring. The resultant polymer was isolated by filtering and washed thoroughly by methanol. The polymer was purified by dissolving in THF and precipitated in DI water. Finally the polymer was dried in 50° C. vacuum oven until constant weight. 2.5 g of SiBCP was obtained. The polymer had a Mw of 38032 g/mol, a Mn of 36280 g/mol and PDI of 1.04.

Example 4

Testing Example

SiBCP made above was dissolved in PGMEA to prepare a 1.3 wt % solution. The solution was filtered with a 0.2 μm PTFE microfilter. The solution was spin cast on 6 inch silicon wafer at a rpm of 2200 for 30 seconds to obtain 28 nm thin film and the SiBCP film was annealed at 130° C. in air for 5 min. The film was subject to 15 seconds of $CF_4$ plasma etch to remove the top Si wetting layer and then etched with 20 seconds of $O_2$ plasma to remove PS (etcher: MARCH etcher, Nordson Corp.). Self-assembly line pattern were observed under NanoSEM, indicating that the SiBCP was thermally annealable and formed parallel BCP cylinder finger print morphology for line patterns with regards to the substrate because a perpendicular BCP cylinder morphology with regards to the substrate would have generated a pattern of random holes.

The invention claimed is:

1. A composition for use in directed self-assembly comprising;

i) a block copolymer comprising a repeat unit of structure (1) and a repeat of structure (2), where $R_1$ is hydrogen or $C_1$-$C_4$ alkyl, $R_2$ is selected from a group chosen from hydrogen, $C_1$-$C_4$ alkyl, $C_1$-$C_4$ alkoxy and halide, $R_3$ is selected from a group chosen from hydrogen, $C_1$-$C_4$ alkyl and $C_1$-$C_4$ fluoroalkyl, and $R_4$, $R_5$, $R_6$, $R_7$, $R_8$, $R_9$, $R_{10}$, $R_{11}$, and $R_{12}$ are independently chosen from $C_1$-$C_4$ alkyl and n=1-6; and,

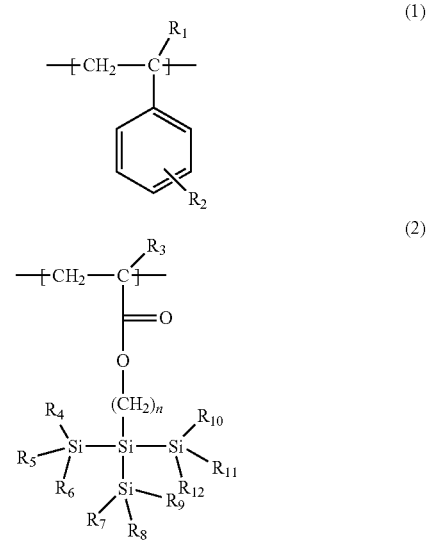

ii) solvent.

2. The composition according to claim 1 where the block copolymer has a molar ratio of repeat unit (1) to repeat unit (2) in the range of 1.2 to 0.8.

3. The composition according to claim 1 where $R_1$ is hydrogen, $R_2$ is hydrogen or $C_1$-$C_4$ alkyl, $R_3$ is $C_1$-$C_4$ alkyl or $C_1$-$C_4$ fluoroalkyl, and $R_4$, $R_5$, $R_6$, $R_7$, $R_8$, $R_9$, $R_{10}$, $R_{11}$, and $R_{12}$ are each methyl and n=2-6.

4. The composition according to claim 1 where $R_1$ is hydrogen, $R_2$ is hydrogen, $R_3$ is $C_1$-$C_4$ alkyl, and $R_4$, $R_5$, $R_6$, $R_7$, $R_8$, $R_9$, $R_{10}$, $R_{11}$, and $R_{12}$ are each methyl and n=2-6.

5. The composition according to claim 1 where $R_1$ is hydrogen, $R_2$ is hydrogen, $R_3$ is methyl, and $R_4$, $R_5$, $R_6$, $R_7$, $R_8$, $R_9$, $R_{10}$, $R_{11}$, and $R_{12}$ are each methyl and n=3.

6. The composition according to claim 1 where the block copolymer has a molar ratio of repeat (1) to repeat unit (2) in the range of 5.3 to 8.0.

7. The composition according to claim 1 where the block copolymer has a molar ratio of repeat unit (1) to repeat unit (2) in the range of 7.3 to 6.0.

8. The composition of claim 1 wherein the concentration of the block copolymer in the solvent is between 0.5 to 5 wt % of the total composition.

9. The composition of claim 1 where the solvent is selected from a group chosen from 1,2-propanediol $C_1$-$C_4$ alkyl ether $C_1$-$C_4$ alkylcarboxylate, $C_1$-$C_4$ alkyl $C_1$-$C_4$ alkylcarboxylate and mixtures thereof.

10. A process for directed self-assembly patterning comprising steps of;

i) coating the block copolymer composition of claim 1 over a substrate to form a block copolymer film;
ii) applying a flow bake to the block copolymer film;
iii) applying an annealing bake to cause self-assembly of the block copolymer; and, iv) developing the self-assembled polymer structure to form a pattern array.

11. The process of claim 10 where in step iv) the development is done by dry plasma etching with a plasma containing oxygen.

12. The process of claim 10 where in step ii) the flow bake is in the range of 100° C. to 160° C.

13. The process of claim 10 where in step iii) the annealing bake is in the range of 150° C. to 200° C. and is done in air.

14. The process of claim 10 where in step iii) the annealing bake is in the range of 150° C. to 250° C. and is done in nitrogen.

15. A block copolymer comprising a repeat unit (1) and a repeat unit (2), where $R_1$ is hydrogen or $C_1$-$C_4$ alkyl, $R_2$ is selected from a group chosen from hydrogen, $C_1$-$C_4$ alkyl, $C_1$-$C_4$ alkoxy and halide, $R_3$ is selected from a group chosen from hydrogen, $C_1$-$C_4$ alkyl and $C_1$-$C_4$ fluoroalkyl, and $R_4$, $R_5$, $R_6$, $R_7$, $R_8$, $R_9$, $R_{10}$, $R_{11}$, and $R_{12}$ are independently chosen from a $C_1$-$C_4$ alkyl and n=1-6

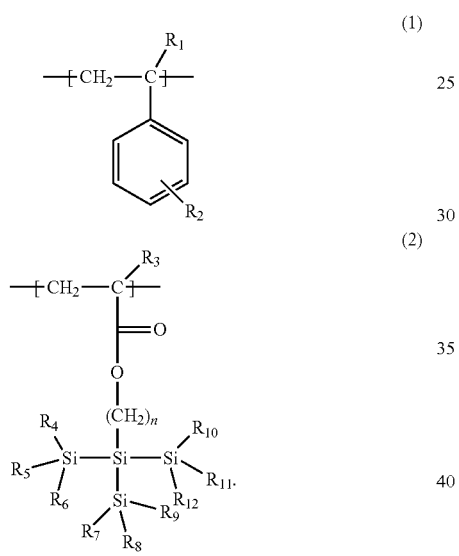

16. The block copolymer according to claim 15 where the block copolymer has a molar ratio of repeat unit (1) to repeat unit (2) of 5.3 to 8.0.

17. The block copolymer according to claim 16 where $R_1$ is hydrogen, $R_2$ is hydrogen or $C_1$-$C_4$ alkyl, $R_3$ is $C_1$-$C_4$ alkyl or $C_1$-$C_4$ fluoroalkyl, and $R_4$, $R_5$, $R_6$, $R_7$, $R_8$, $R_9$, $R_{10}$, $R_{11}$, and $R_{12}$ are each methyl and n=2-6.

18. The block copolymer according to claim 17 where $R_1$ is hydrogen, $R_2$ is hydrogen or $C_1$-$C_4$ alkyl, $R_3$ is $C_1$-$C_4$ alkyl or $C_1$-$C_4$ fluoroalkyl, and $R_4$, $R_5$, $R_6$, $R_7$, $R_8$, $R_9$, $R_{10}$, $R_{11}$, and $R_{12}$ are each methyl and n=3-6.

19. The block copolymer according to claim 15 where the block copolymer has a molar ratio of repeat unit (1) to repeat unit (2) in the range of 7.3 to 6.0.

20. The block copolymer according to claim 15 where the block copolymer has a molar ratio of repeat unit (1) to repeat unit (2) of 1.2 to 0.8.

21. A composition for use in directed self-assembly comprising;
i) a block copolymer comprising a repeat unit of structure (1) and a repeat of structure (2), where $R_1$ is hydrogen or $C_1$-$C_4$ alkyl, $R_2$ is selected from a group chosen from hydrogen, $C_1$-$C_4$ alkyl, $C_1$-$C_4$ alkoxy and halide, $R_3$ is selected from a group chosen from hydrogen, $C_1$-$C_4$ alkyl and $C_1$-$C_4$ fluoroalkyl, and $R_4$, $R_5$, $R_6$, $R_7$, $R_8$, $R_9$, $R_{10}$, $R_{11}$, and $R_{12}$ are independently chosen from $C_1$-$C_4$ alkyl

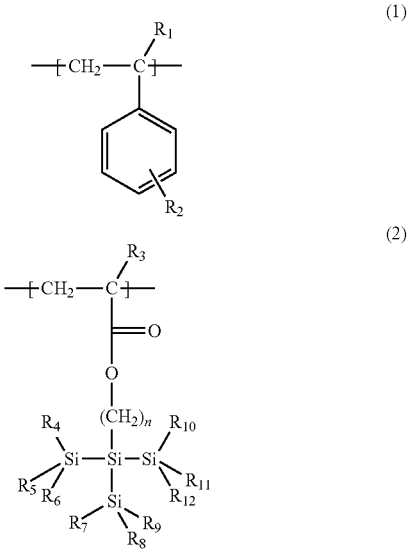

ii) solvent.

* * * * *